(12) United States Patent
Lewicki et al.

(10) Patent No.: US 10,138,330 B2
(45) Date of Patent: Nov. 27, 2018

(54) SILICONE ELASTOMERS CAPABLE OF LARGE ISOTROPIC DIMENSIONAL CHANGE

(71) Applicant: LAWRENCE LIVERMORE NATIONAL SECURITY, LLC, Livermore, CA (US)

(72) Inventors: James Lewicki, Oakland, CA (US); Marcus A. Worsley, Hayward, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days.

(21) Appl. No.: 15/584,711

(22) Filed: May 2, 2017

(65) Prior Publication Data

US 2017/0235222 A1    Aug. 17, 2017

Related U.S. Application Data

(63) Continuation of application No. 14/189,964, filed on Feb. 25, 2014, now Pat. No. 9,708,451.

(51) Int. Cl.
| | |
|---|---|
| *C08G 77/32* | (2006.01) |
| *G03F 7/00* | (2006.01) |
| *C08J 3/075* | (2006.01) |
| *C08G 77/20* | (2006.01) |
| *C08K 5/5419* | (2006.01) |
| *C08K 5/56* | (2006.01) |

(52) U.S. Cl.
CPC ............. *C08G 77/32* (2013.01); *C08G 77/20* (2013.01); *C08J 3/075* (2013.01); *C08K 5/5419* (2013.01); *C08K 5/56* (2013.01); *G03F 7/0002* (2013.01); *B01L 2200/12* (2013.01); *B01L 2400/04* (2013.01); *C08J 2383/04* (2013.01); *Y10T 428/24802* (2015.01)

(58) Field of Classification Search
None
See application file for complete search history.

(56) References Cited

U.S. PATENT DOCUMENTS

| | | | |
|---|---|---|---|
| 3,952,730 A | 4/1976 | Key | |
| 6,063,314 A * | 5/2000 | Chadwick | A61C 13/0003 264/16 |
| 6,923,923 B2 | 8/2005 | Cheon et al. | |
| 2002/0050220 A1 | 5/2002 | Schueller et al. | |
| 2004/0220510 A1 | 11/2004 | Koullick et al. | |
| 2008/0272516 A1 * | 11/2008 | Liu | B29C 59/18 264/313 |
| 2013/0317541 A1 | 11/2013 | Singhal et al. | |
| 2014/0142207 A1 | 5/2014 | Singhal et al. | |
| 2015/0240035 A1 | 8/2015 | Lewicki et al. | |

OTHER PUBLICATIONS

"Measurement of Thickness Dilation in Polymer Films" authored by Pope et al., and published in the Journal of Polymer Science: Part B: Polymer Physics (1989) 27, 1173-1177.*
Arkles, B. (1983) "Look what you can make out of silicones," Chemtech 13:542-555.
Baumann, T.F. et al. (2008) "High surface area carbon aerogel monoliths with hierarchical porosity," Journal of Non-Crystalline Solids 354:3513-3515.
Beiner, J. et al. (2012) "Graphene: Macroscopic 3D Nanographene with Dynamically Tunable Bulk Properties," Advanced Materials 24(37):5017.
Biener, J. et al. (2011) "Advanced carbon aerogels for energy applications," Energy & Environmental Science 4:656-667.
Favre, E. (1996) "Swelling of Crosslinked Polydimethylsiloxane Networks by Pure Solvents: Influence of Temperature," Eur. Polym. J. 32(10):1183-1188.
Flory, P.J. et al. (1966) "Random-Coil Configurations of Vinyl Polymer Chains. The Influence of Stereoregularity on the Average Dimensions," J. Am. Chem. Soc. 88(4):639-650.
Grimes, A. et al. (2008) "Shrinky-Dink microfluidics: rapid generation of deep and rounded patterns," Lab Chip 8:170-172.
Hearon, K. et al. (2013) "Electron Beam Crosslinked Polyurethane Shape Memory Polymers with Tunable Mechanical Properties," Macromol. Chem. Phys. 214:1258-1272.
Hearon, K. et al. (2013) "Porous Shape Memory Polymers," Polym Rev (Phila Pa) 53(1):41-75.
Horn, T.J. et al. (2012) "Overview of current additive manufacturing technologies and selected applications," Science Progress 95(3):255-285.
Hwang, W. et al. (2012) "Estimation of aneurysm wall stresses created by treatment with a shape memory polymer foam device," Biomech Model Mechanobiol. 11(5):715-729.
Koster, S. (2013) "Microfluidics—from fundamental research to industrial applications," J. Phys. D: Appl. Phys. 46:110301, 2 pages.
Lai, K.L. et al. (2009) "Soft imprint lithography using swelling/deswelling characteristics of a polymer mold and a resist induced by a poor solvent," J. Micromech. Microeng. 19:037001.
Lemu, H.G. (2012) "Study of capabilities and limitations of 3D printing technology," AIP Conf. Proc. 1431:857.
Lewicki, J.P. et al. (2008) "Effect of meta-Carborane on Segmental Dynamics in a Bimodal Poly(dimethylsiloxane) Network," Macromolecules 41(23):9179-9186.
Lewicki, J.P. et al. (2008) "The stability of polysiloxanes incorporating nano-scale physical property modifiers," Science and Technology of Advanced Materials 9:024403, 8 pages.
Lewicki, J.P. et al. (2012) "NMR and Thermal Analytical Investigations of Structure Property Relationships in End-Linked Model PDMS Networks," Abstracts of Papers of the American Chemical Society 2012:243.

(Continued)

*Primary Examiner* — Marc S Zimmer
(74) *Attorney, Agent, or Firm* — Foley & Lardner LLP

(57) ABSTRACT

Described herein is a highly effective route towards the controlled and isotropic reduction in size-scale, of complex 3D structures using silicone network polymer chemistry. In particular, a class of silicone structures were developed that once patterned and cured can 'shrink' micron scale additive manufactured and lithographically patterned structures by as much as 1 order of magnitude while preserving the dimensions and integrity of these parts. This class of silicone materials is compatible with existing additive manufacture and soft lithographic fabrication processes and will allow access to a hitherto unobtainable dimensionality of fabrication.

19 Claims, 5 Drawing Sheets

(56) References Cited

OTHER PUBLICATIONS

Lewicki, J.P. et al. (2012) "Thermal Degradation Behavior and Product Speciation in Model Poly(dimethylsiloxane) Networks," Journal of Inorganic and Organometallic Polymers and Materials 22(3):636-645.

Lewicki, J.P. et al. (2013) "Pyrolysis-gas chromatography/mass spectrometry for the forensic fingerprinting of silicone engineering elastomers," Journal of Analytical and Applied Pyrolysis 99:85-91.

Lewis, J.A. et al. (2006) "Direct Ink Writing of Three-Dimensional Ceramic Structures," Journal of the American Ceramic Society 89(12):3599-3609.

Liu, Y. et al. (2002) "Application of microforging to SiCN MEMS fabrication," Sensors and Actuators A: Physical 95(2-3):143-151.

Maitland, D.J. et al. (2009) "Design and Realization of Biomedical Devices Based on Shape Memory Polymers," MRS Proceedings 1190:1190-NN06-01.

Mayer, B.P. et al. (2011) "Linking Network Microstructure to Macroscopic Properties of Siloxane Elastomers Using Combined Nuclear Magnetic Resonance and Mesoscale Computational Modeling," Macromolecules 44(20):8106-8115.

Mayer, B.P. et al. (2012) "Nuclear magnetic resonance and principal component analysis for investigating the degradation of poly[chlorotrifluoroethylene-co-(vinylidene fluoride)] by ionizing radiation," Polymer Degradation and Stability 97(7):1151-1157.

Pauzauskie, P.J. et al. (2011) "Synthesis and characterization of a nanocrystalline diamond aerogel," Proc. Nat. Acad. Sci. 108(21):8550-8553.

Pope, D.S. et al. (1989) "Measurement of Thickness Dilation in Polymer Films," Journal of Polymer Science: Part B: Polymer Physics 27:1173-1177.

Rodriguez, J.N. et al. (2013) "In vivo tissue response following implantation of shape memory polyurethane foam in a porcine aneurysm model," Journal of Biomedical Materials Research Part A.

Shrirao, A.B. et al. (2012) "Adhesive-tape soft lithography for patterning mammalian cells: application to wound-healing assays," BioTechniques Rapid Dispatches:315-318.

Singhal, P. et al. (2010) "Controlling the Physical Properties of Random Network Based Shape Memory Polymer Foams," MRS Proceedings 1274:1274-QQ05-01.

Singhal, P. et al. (2012) "Ultra Low Density and Highly Crosslinked Biocompatible Shape Memory Polyurethane Foams," J Polym Sci B Polym Phys. 50(10):724-737.

Singhal, P. et al. (2013) "Controlling the Actuation Rate of Low-Density Shape-Memory Polymer Foams in Water," Macromolecular Chemistry and Physics 214(11):1204-1214.

Small, W. IV et al. (2010) "Biomedical applications of thermally activated shape memory polymers," J Mater Chem. 20(18):3356-3366.

Stadermann, M. et al. (2012) "Radiation tolerance of ultra-thin Formvar films," Applied Physics Letters 101:071908.

Steiner, S.A. III et al. (2009) "Nanoscale Zirconia as a Nonmetallic Catalyst for Graphitization of Carbon and Growth of Single- and Multiwall Carbon Nanotubes," J. Am. Chem. Soc. 131:12144-12154.

Wong, K.V. et al. (2012) "A Review of Additive Manufacturing," International Scholarly Research Network Mechanical Engineering 2012:1-10.

Worsley, M.A. et al. (2009) "High surface area carbon nanotube-supported titanium carbonitride aerogels," J. Mater. Chem. 19:5503-5506.

Worsley, M.A. et al. (2009) "Mechanically robust and electrically conductive carbon nanotube foams," Applied Physics Letters 94:073115.

Worsley, M.A. et al. (2009) "Stiff and electrically conductive composites of carbon nanotube aerogels and polymers," Journal of Materials Chemistry 19:3370-3372.

Worsley, M.A. et al. (2010) "Synthesis of Graphene Aerogel with High Electrical Conductivity," J. Am. Chem. Soc. 132:14067-14069.

Worsley, M.A. et al. (2011) "High Surface Area, sp2-Cross-Linked Three-Dimensional Graphene Monoliths," J. Phys. Chem. Lett. 2:921-925.

Worsley, M.A. et al. (2012) "Mechanically robust 3D graphene macroassembly with high surface area," Chem. Commun. 48:8428-8430.

Yoshida, M. et al. (2008) "Smart Nanomaterials," ACS Nano 2(6):1101-1107.

Non-Final Office Action in U.S. Appl. No. 14/189,964, dated Sep. 8, 2016.

Final Office Action in U.S. Appl. No. 14/189,964, dated Dec. 22, 2016.

Notice of Allowance in U.S. Appl. No. 14/189,964, dated Apr. 10, 2017.

* cited by examiner

SILICONE ELASTOMERS CAPABLE OF LARGE ISOTROPIC DIMENSIONAL CHANGE

CROSS REFERENCE TO RELATED APPLICATIONS

This application is a continuation of U.S. patent application Ser. No. 14/189,964 filed Feb. 25, 2014, which is hereby incorporated by reference in its entirety.

STATEMENT REGARDING FEDERALLY SPONSORED RESEARCH OR DEVELOPMENT

The United States Government has rights in the invention pursuant to Contract No. DE-AC52-07NA27344 between the U.S. Department of Energy and Lawrence Livermore National Security, LLC, for the operation of Lawrence Livermore National Laboratory.

BACKGROUND

One of the key goals of many modern advanced manufacturing processes is the fabrication of complex structures on a micron or nanometer scale in a fast, reliable and cost-effective manner (Wang et al., *Mechanical Engineering* 20:10, 2012; Horn et al., *Science Progress* 95:82, 2012; and Lewis et al., *Journal of the American Ceramic Society* 89:3599, 2006). It is well accepted that the ability to form highly ordered micro-nano scale structures and surfaces is a pre-requisite for advancement in many fields including; microfluidics (Koster et al., *Applied Physics* 46:1, 2013), controlled mammalian cell culture (Anil et al., *Bio Techniques* 53:315, 2012), responsive smart surfaces (Yoshida et al., *ACS Nano* 20:1101, 2008), micro-mechanical devices (Liva et al., *Sensors and Actuators A: Physical* 95:143, 2002) and next generation engineering materials (Wang et al., *Mechanical Engineering* 20:10, 2012; Horn et al., *Science Progress* 95:82, 2012; and Lewis et al., *Journal of the American Ceramic Society* 89:3599, 2006).

While the majority of current methods (e.g. 3D-printing) for high-resolution, high-aspect-ratio patterning rely on the direct formation of a structure, pattern or repeat unit at the desired size-scale. The lower limits of the pattern dimensions are therefore constrained by the current state of the art in the engineering tools employed to physically pattern these structures (Lemu et al., *AIP Conference Proceedings* 1431: 857, 2012; Wang et al., *Mechanical Engineering* 20:10, 2012; and Horn et al., *Science Progress* 95:82, 2012).

There have been efforts in the field that are focused on reducing the size scale of soft lithographic (Koster et al., *Applied Physics* 46:1, 2013), additive manufactured structures (Wang et al., *Mechanical Engineering* 20:10, 2012), and in actuation (Yoshida et al., *ACS Nano* 20:1101, 2008) and mechanical modification of materials as a function of external forces (Liva et al., *Sensors and Actuators A: Physical* 95:143, 2002). Most notably, Grime et al. demonstrated the use of commercially produced biaxially oriented polystyrene to realize the thermal shrinkage of microfluidics patterns (Grime et al., *Lab Chip* 8:170, 2008). However, their process is neither tunable nor reversible and is limited to polystyrene.

Thus, a need exists for a novel and effective system for controllable and reversible isotropic size-scale reduction or expansion of complex 3D structures using silicone polymer chemistry. The ideal approach should have versatile silicone chemistry, elegant simplicity, relatively low materials cost, broad applicability, tunable material properties, and ease of manufacturing.

SUMMARY

Embodiments provided herein include compositions, devices, and articles, as well as methods of making and methods of using the compositions, devices, and articles.

Many embodiments described herein relate to a method for making a silicone-based elastomer adapted for isotropic reduction and/or expansion, comprising mixing crosslinked poly(siloxane) with a guest molecule to provide the silicone-based elastomer.

In some embodiments, the method further comprises isotropically reducing a dimension of the silicone-based elastomer by removing the guest molecule. In one embodiment, the dimension of the silicone-based elastomer is isotropically reduced by at least 20 volume %. In another embodiment, the dimension of the silicone-based elastomer is isotropically reduced by at least 50 volume %.

In one embodiment, the method further comprises molding and/or etching the silicone-based elastomer to form a pattern comprising at least one line having a width of 500 μm or less, before removing the guest molecule. In another embodiment, the method further comprises lithographically depositing the silicone-based elastomer onto a substrate to form a pattern comprising at least one line having a width of 500 μm or less, before removing the guest molecule.

In one embodiment, the crosslinked poly(siloxane) comprises crosslinked poly(alkyl siloxane). In a further embodiment, the crosslinked poly(siloxane) comprises crosslinked poly(dimethyl siloxane).

In one embodiment, the crosslinked poly(siloxane) is obtained by reacting a reaction mixture comprising poly (siloxane) and an organo-tetra-silane crosslinker. In a further embodiment, the crosslinked poly(siloxane) is obtained by reacting a reaction mixture comprising poly(siloxane) with tetrakis-dimethyl-methoxysilane.

In one embodiment, the crosslinked poly(siloxane) is obtained by reacting a reaction mixture comprising vinyl-terminated poly(siloxane) with a crosslinker, wherein the ratio of silane to vinyl in the reaction mixture is between 0.5-4.

In one embodiment, the crosslinked poly(siloxane) is obtained by reacting a reaction mixture comprising vinyl-terminated poly(siloxane) with a crosslinker, wherein the molar mass of the poly(siloxane) is between 5,000 to 200,000 g/mol.

In one embodiment, the silicone-based elastomer is a gel comprising at least 30 volume % occupied by the guest molecule. In a further embodiment, the silicone-based elastomer is a gel comprising at least 50 volume % occupied by the guest molecule.

In one embodiment, the guest molecule has an affinity for the poly(siloxane) that is greater than the poly(siloxane)'s own intra/intermolecular interaction strength.

In one embodiment, the guest molecule is a volatile solvent molecule evaporable by heating.

Also described here is a composition comprising a silicone-based elastomer adapted for isotropic reduction and/or expansion, the silicone-based elastomer comprising a network of crosslinked poly(siloxane) having its internal space occupied by a guest molecule.

In one embodiment, the silicone-based elastomer is a gel comprising at least 50 volume % occupied by the guest molecule. In one embodiment, the silicone-based elastomer comprises crosslinked poly(dimethyl siloxane).

Further described here is a patterned structure comprising at least one line having a width of 100 μm or less, wherein the line comprises an isotropically reduced silicone-based elastomer comprising crosslinked poly(siloxane), the crosslinked poly(siloxane) comprising polymer chains in random coil configuration.

DETAILED DESCRIPTION

Introduction

Figure 1:
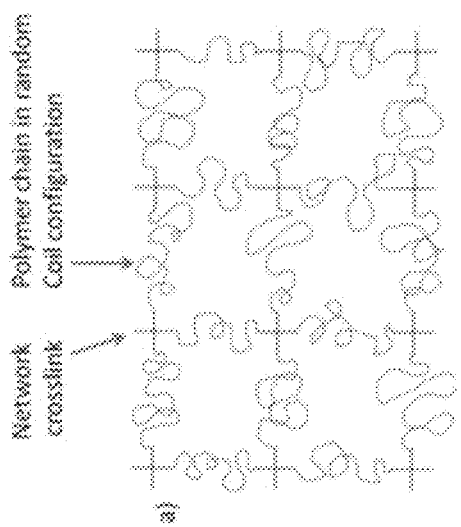
FIG. 1 shows an exemplary silicone network. a) Tetrafunctional crosslinks 'pin' polymer chains to form a 3-dimensional network. In the melt-phase the polymer chains reside in a random coil configuration. b) If the network is synthesized in the presence of a guest molecule, the chains are forced into an expanded state and the volume of the resultant elastomer formed, is increased.
Figure 1:
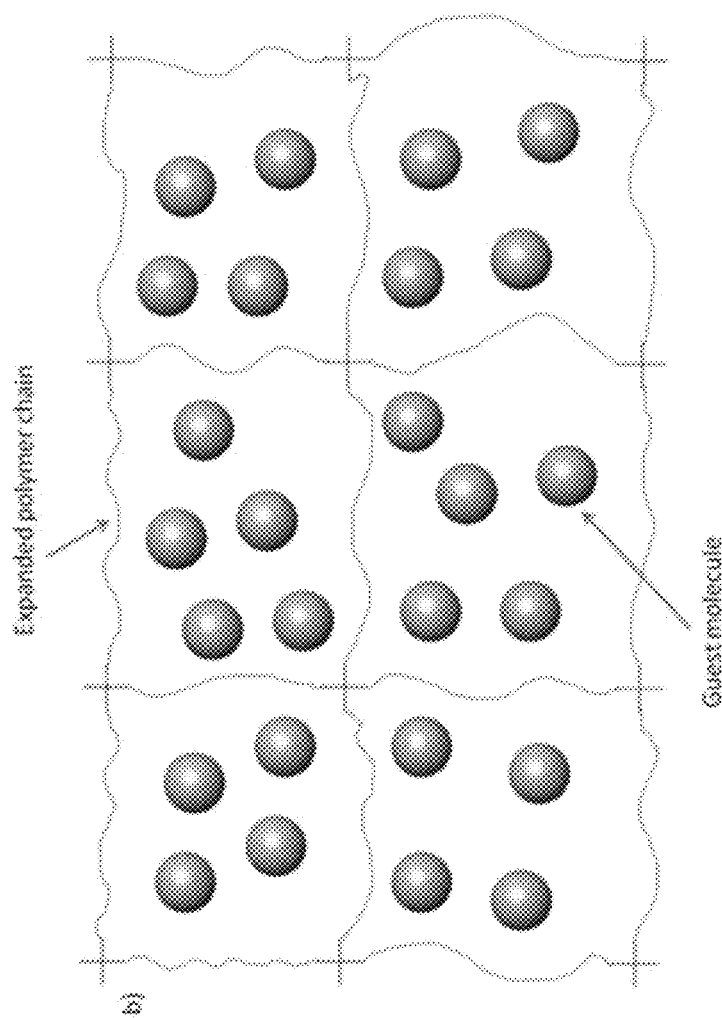

References cited herein can be used to practice and better understand the claimed inventions and are incorporated by reference herein in their entireties.

The methods and compositions described herein are both elegant and complimentary to existing techniques and technologies, in that it focuses on the actual material for printing and not the tools. For example, disclosed herein is a class of silicone-based elastomer resins that can be patterned, shaped or written at a given dimension and can subsequently be triggered to contract or expand isotropically by a predetermined amount (i.e., effectively reducing or expanding the size scale of the entire system by a controlled degree), with little loss of resolution in structure. This class of silicone material can be used to pattern micron-scale structures by direct-write lithography that are shrinkable by as much as 1 order of magnitude while preserving the dimensions and integrity of the patterned structures. This class of silicone material is compatible with existing additive manufacture and soft lithographic fabrication processes and thus allows access to a hitherto unobtainable, facile and precise control over the advanced fabrication of three-dimensional micro-nano scale structures for various applications.

Silicon-Based Elastomer

Many embodiments described herein relate to a silicon-based elastomer, comprising a network of crosslinked poly(siloxane) embedded with a guest molecule. The silicon-based elastomer can be, for example, in the form of a gel. The silicon-based elastomer can be provided by, for example, a sol-gel reaction.

The silicon-based elastomer can be mechanically robust. The silicon-based elastomer can have, for example, a Young's modulus in the range of 0.5-3 MPa. The silicon-based elastomer can have, for example, a elongation at break of 100-250%. The silicon-based elastomer can have, for example, a relative tear strength sufficient to allow removal of the substrate from a mold pattern of other form without breakage of the silicone elastomer part.

In the silicon-based elastomer, the guest molecule can occupy the intra-/inter-molecular space of the crosslinked poly(siloxane). The silicon-based elastomer can comprise, for example, at least 30 volume % occupied by the guest molecule. The silicon-based elastomer can comprise, for example, at least 50 volume % occupied by the guest molecule. The silicon-based elastomer can comprise, for example, at least 70 volume % occupied by the guest molecule. The silicon-based elastomer can comprise, for example, at least 90 volume % occupied by the guest molecule.

The dimension of the silicon-based elastomer can be isotropically reduced by removing the guest molecule from the silicon-based elastomer. The dimension of the silicon-based elastomer can be isotropically reduced by, for example, at least 20%. The dimension of the silicon-based elastomer can be isotropically reduced by, for example, at least 50%. The dimension of the silicon-based elastomer can be isotropically reduced by, for example, at least 70%. The dimension of the silicon-based elastomer can be isotropically reduced by, for example, at least 90%.

In some embodiments, the guest molecule and the poly(siloxane) are not linked by covalent bond. In some embodiments, the removal of the guest molecule from the silicon-based elastomer does not break any covalent bond. The guest molecule may either interact with the silicone network though a non-specific physical interaction (e.g., solvation) or through a specific (reversible) chelating, ionic or coordination interaction with specific chemical moieties on the polymer chains such as, but not limited to, vinyl, carboxylic acid or inorganic ligands and formal charged species such as, but not limited to, a quaternary ammonium salt functional group.

In one embodiment, a silicon-based elastomer structure can be formed in the swollen state and be made to undergo isotropic reduction in size scale. In another embodiment, the same model materials can also be made in a condensed state and be allowed to undergo isotropic expansion when exposed to a suitable solvent guest environment. This process is fully reversible. Isotropic expansion and contraction may be harnessed for mechanical movement through the fabrication of bilayers and other structures for the purposes of, for example, actuation, sensing and controlled alteration of surface properties.

The degree of dimensional change can be adjusted by the choice and quantity of the guest molecule and the size of the polymer chains making up the network. By varying the size (molecular weight) of the polymer chains between crosslinks, the degree of dimensional change can be controlled and tailored to the end application. In addition, by the controlled synthesis of ordered multi-modal networks with two or more distributions of chain lengths, the networks can undergo controlled non-isotropic expansion or contraction, in a particular dimension.

By altering the physical properties of the silicone with controlled addition of high surface area fillers and surface segregating release agents, isotropic materials can be readily produced that exhibit the physical stiffness, thixotropic and surface adhesion properties required for direct-in-write (DIW) applications as well as for the formation of complex 3D structures. Written structures can be subsequently cured and induced to undergo a desired dimensional change and even sintered to form inorganic parts.

By altering the chemistry of the network formation reactions, a material can be obtained that will 'cure' under UV light rather than heat, which allows projection microstereolithography (PµSL) of structures capable of dimensional change.

Crosslinked Poly(Siloxane)

In some embodiments, the crosslinking of poly(siloxane) is carried out as described in, for example, Lewicki et al., *Macromolecules* 41:9179 (2008), Mayer et al., *Macromolecules* 20:8106 (2011), and Lewicki et al., *J. Inorg. Organomet. Polym.* 22:636 (2012), all of which are incorporated herein by reference in their entireties.

The network of crosslinked poly(siloxane) can be obtained by reacting a reaction mixture comprising at least one poly(siloxane) and at least one crosslinker. The reaction mixture can comprise, for example, at least two types of crosslinkers. The reaction mixture can comprise, for example, at least two types of poly(siloxane). The reaction mixture can comprise, for example, at least one catalyst such as an organometallic catalyst. In one embodiment, the reaction mixture comprises Pt di-vinyl-methyl-siloxane as catalyst. Other embodiments of the catalyst include organo-tin catalysts for condensation curing of silanol and blocked silane ester networks, any number of organoplatinum catalysts from the Karstedt's family for vinyl silane addition curing, amine, tin, and Ytterbium triflate based catalysts for the epoxy modified silicone based materials, and photo-acid initiator catalysts for UV curable silicone network chemistries.

The poly(siloxane) can be, for example, poly(alkyl/aryl siloxane). The poly(siloxane) can be, for example, poly (dimethyl siloxane). Other embodiments of the poly(siloxane) include poly(phenylmethylsiloxane) and poly(methylhydrosiloxane). As used herein, the term "poly(siloxane)" encompasses both homopolymers of poly(siloxane) and random, block, and alternating copolymers comprising poly (siloxane), such as poly(alkyl/aryl siloxane)-co-Poly(ethyleneglycol).

The polysiloxanes may can comprise one or more reactive end-groups, such as silanes, silanols, vinyls or epoxies or amines with a corresponding crosslinker. The polysiloxanes can have, in addition to reactive end-groups, reactive or otherwise functional side chains of co-polymer segments which allow the further tailoring of specific chain-guest interactions. Examples include, but are not limited to, chelating ligands, additional crosslinkable moieties, pendant on the chains, amphiphilic co-polymer segments, pendant groups with formal ionic charges or hydrophobic/hydrophilic pendants.

The crosslinker can be, for example, an organo-tetrasilane crosslinker. The crosslinker can be, for example, tetrakis-dimethyl-methoxysilane. Other embodiments of the crosslinker include tetra vinyl, cyclo-tetravinyl octamethyl siloxanes, octa vinyl, silane or silanol POSS species, blocked tetra(alkyl) silanes such as TEOS, and multi-functional amines or epoxies.

The poly(siloxane) can have a molar mass of, for example, 5,000 to 200,000 g/mol, or 10,000 to 100,000 g/mol, or 20,000 to 50,000 g/mol.

The poly(siloxane) can be, for example, vinyl-terminated for reacting with the crosslinker. In the reaction mixture, the ratio of silane to vinyl can be, for example, between 0.5-4, or between 1 and 3, or between 1.5 to 2, or about 1.75.

In some embodiments, the poly(siloxane) can be cured by a photo-activated process. The poly(siloxane) can be, for example, oxirane-functionalized for reacting with a polyol crosslinker in the presence of a photo-acid catalyst.

Guest Molecule

The guest molecule can be, for example, a non-reactive molecular additive (e.g., a solvent) with an affinity for the polymer chain that is greater than the polymer chain's own intra/intermolecular interaction strength. In other words, the guest molecule can satisfy the theta ($\Phi$) conditions of the poly(siloxane), and the poly(siloxane) network can expand or swell when exposed to the guest molecule. The guest molecule can be, for example, miscible with the polymer network. The guest molecule can be, for example, not phase separable from the polymer network. The guest molecule can be, for example, a powerful solvent for the polymer system (i.e., better than a theta solvent).

In some embodiments, the guest molecule is a volatile solvent molecule. The volatile solvent molecule can be, for example, toluene. Other embodiments of the guest molecule include oligomeric crosslinked polysiloxane gels, paratoluenesulfonic acid, ammonia, hexanes, octanes, parafins, methanol, acetone, and ionic solvents.

The volatile solvent molecule can be, for example, evaporable upon heating. The volatile solvent molecule can be, for example, evaporable at a temperature of 100° C. or less, or 80° C. or less. The volatile solvent molecule can be, for example, evaporable under high pressures and at low temperatures (e.g., gases such as $CO_2$ and methane may act as guest species). The guest molecule can have, for example, a high bp and a low vapor pressure, so that it will not evaporate however it can have an ionic charge—such as an ionic solvent to allow electrophoretic expulsion of the guest.

In other embodiments, the guest molecules are not limited to volatile solvents. High molecular weight oligomeric species can be employed to tailor contraction at high temperatures and low pressures, such as oligomeric crosslinked polysiloxane. Charged guest species can also be employed to obtain a structure that contracts, primarily, under the influence of an electric field gradient.

Process for Making Silicon-Based Elastomer and Patterns

Many embodiments described herein relate to a process for making the aforementioned silicon-based elastomer, the dimension of which can be isotropically reduced.

In some embodiments, the process include mixing crosslinked poly(siloxane) with a guest molecule in order to provide the silicon-based elastomer. The mixture can be, for example, in the form of a precursor sol. The precursor sol can be, for example, converted into a gel by sol-gel reaction as known in the art.

The gel can be, for example, cured, molded, etched, or directly written onto a substrate to form a pattern. The pattern can have, for example, at least one feature having a lateral dimension of 500 µm or less, or 200 µm or less, or 100 µm or less, or 50 µm or less, or 20 µm or less, or 10 µm or less, or 5 µm or less, or 2 µm or less. The pattern can have, for example, at least one line having a width of 500 µm or less, or 200 µm or less, or 100 µm or less, or 50 µm or less, or 20 µm or less, or 10 µm or less, or 5 µm or less, or 2 µm or less.

After the removal of the guest molecule, the pattern can be isotropically reduced to comprise, for example, at least one feature having a lateral dimension that is at least 30% reduced, or at least 50% reduced, or at least 70% reduced, or at least 90% reduced. The pattern can be isotropically reduced to comprise, for example, at least one line having a width that is at least 30% reduced, or at least 50% reduced, or at least 70% reduced, or at least 90% reduced. In one embodiment, the isotropically reduced pattern comprises a feature having a lateral dimension of 1 µm or less. In another embodiment, the isotropically reduced pattern comprises a line having a width of 1 µm or less.

In some embodiments, an isotropic reduction refers to a reduction along two or more dimensions (e.g., orthogonal dimensions), in which extents of reduction along the dimensions differ by less than or equal to ±30%, such as less than or equal to ±25%, less than or equal to ±20%, less than or equal to ±15%, less than or equal to ±10%, or less than or equal to ±5%.

In addition, the silicon-based elastomer can be isotropically expanded when being exposed to the guest molecule. For example, the silicon-based elastomer can be isotropically expanded by at least 30%, or at least 50%, or at least 100%, or at least 200%. In other words, the isotropic reduction/expansion of the silicon-based elastomer can be reversible.

Applications

The silicon-based elastomer described herein are suitable for various applications. In one embodiment, the silicon-based elastomer can be used as a soft polymer lithography media that is capable of reversible isotropic dimensional change.

In another embodiment, the silicon-based elastomer can be used as 'ink' media for UV-curable micro-scale lithographic writing applications, including projection microstereolithography (PµSL), that is capable of reversible isotropic dimensional change.

In a further embodiment, the silicon-based elastomer described herein can be used for 3D-microfluidic device fabrication.

In an additional embodiment, the silicon-based elastomer described herein can be used for Direct Ink Write additive manufacture of polymeric and metallic structures capable of reversible isotropic dimensional change.

In yet another embodiment, the silicon-based elastomer described herein can be used for formulation of 3D-printing ink media capable of reversible isotropic dimensional change.

In yet a further embodiment, the silicon-based elastomer described herein can be used for micro-patterned 'sensing' surfaces that respond to differing gaseous and liquid environments.

In yet an additional embodiment, the silicon-based elastomer described herein can be used for micro-patterned surfaces with tunable hydrophobicity, or for tunable electromagnetic responsive surfaces.

Additional Description of the Figures

Silicone networks are typically synthesized from precursors in the melt-phase and on completion of the network forming chemistries, the final elastomeric part, typically has the same volume as the starting reactant mixture. Under such conditions, the inter-crosslinked chains reside in a low energy random coil configuration (FIG. 1A; see also Flory et al., *J. Am. Chem. Soc.* 88:639, 1966). If however, during the network formation stage a non-reactive molecular additive (a solvent or guest molecule) with an affinity for the polymer chains that is greater than the chain's own intra/intermolecular interaction strength is introduced, the theta conditions for the polymer are satisfied and the network will form in an expanded or swollen state (FIG. 1B).

FIG. 1 shows a silicone network, where tetra-functional crosslinks 'pin' polymer chains to form a 3-dimensional network. In the melt-phase the polymer chains reside in a random coil configuration. If the network is synthesized in the presence of a guest molecule, the chains are forced into an expanded state and the volume of the resultant elastomer formed, is increased.

These crosslinked, swollen networks lie between a gel and an elastomer in their properties, can retain much of their mechanical strength, can be patterned/impressioned and are easily handled. The guest molecule can be readily removed though changing the external temperature and/or pressure by an amount which is determined by the vapor pressure of the guest and the relative interaction parameters of the guest and polymer.

Figure 2:
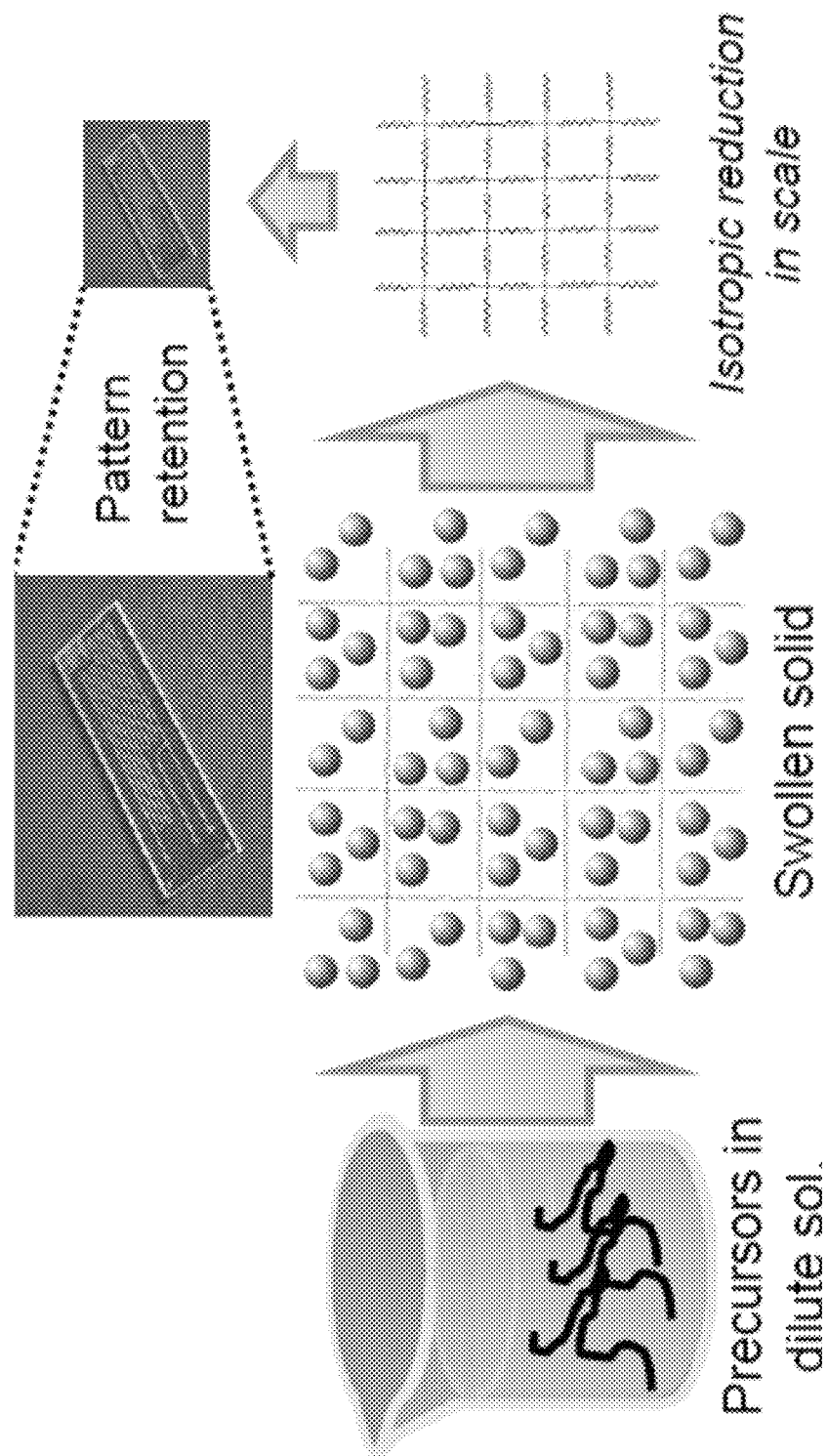
FIG. 2 shows an exemplary silicon-based elastomer that are swelled by guest molecules and then isotropically reduced in scale.

As shown in FIG. 2, with the removal of the guest molecules, the network relaxes back to its lowest energy random coil configuration with an accompanying reduction in internal free volume. The macroscopic consequence of this relaxation is a dimensional contraction of the elastomeric part. However, in a typical silicone network, such swelling and contraction processes do not occur isotropically on a macroscopic scale. Network heterogeneity, chain polydispersity and the variety of complex cure chemistries, additives, fillers and other modifiers added to commercial silicone products (Arkles, *Chemtech* 13:542, 1983) mean that even under ideal theta conditions, expansion or contraction of a network is non-isotropic. Any pattern or shape formed in the swollen state would become severely distorted upon contraction.

In contrast, the new class of silicone-based elastomers described herein are capable of large, ordered, reversible, and isotropic changes in dimension (±1-100 volume %). The relationships between network structure(s) and guest interactions on the macroscopic properties of these materials allow for the possibility of tailoring these systems to perform variable levels of expansion or contraction. The synthesis of network architectures with differing inter-crosslink chain lengths modalities, levels and types of guest molecules will allow for a range of materials properties to be realized. The rheological properties and cure characteristics of the polymers can be modified to make them thixotropic, mechanically robust and with a 'pot-life' sufficient for extended manufacture procedures (>2 hours). The cure chemistry of the polymers can also be modified from a thermally activated process to a photo activated process. This may be achieved by the formulation of oxirane functional PDMS chains with polyol cross-linkers in the presence of a photo-acid catalyst. These systems can therefore be optimized to cure under moderate UV-B conditions which will make them ideal candidates for PμSL applications Further structures can be designed and written based on bi-layers, sandwiches and even hinge type arrangements, which are capable of mechanical movement, actuation and even temperature stimulated assembly of simple structures. Additional stable and well-defined structures can be obtained through UV patterning that are subsequently capable of size scale reduction.

WORKING EXAMPLES

Example 1

Materials

All Poly(dimethylsiloxane) (PDMS) polymers, tetrakis-dimethyl-methoxysilane (TKSIL) crosslinker, Platinum di-vinyl-methylsiloxane catalyst used in this study were obtained from Gelest Inc.

Synthesis of Model 11

An end-linked, tetra-functionally crosslinked network (coded Model 11) was synthesized via a organo-platinum mediated hydrosilation reaction between vinyl terminated poly(dimethylsiloxane) (PDMS) and a organo-tetra-silane crosslinker to form a network elastomer with an average inter-crosslink chain length of 28 kg mol$^{-1}$. Model 11 was formulated in the following manner: 55 Grams of vinyl terminated PDMS (28 kg mol$^{-1}$) was combined with a quantity of TKSIL crosslinker corresponding to a silane to vinyl ratio of 1.75:1 in the presence of 40 ppm of a Pt di-vinyl-methyl-siloxane complex and mixed for 30 seconds using a Flactek™ Speedmixer off-axis centrifugal mixer at a rate of 2500 rpm. The mixed resin was then poured into a 6 by 6 inch by 2 mm deep ASTM D3182 mold and allowed to cure for 12 hours at room temperature. The formed elastomer was subsequently removed from the mold and post-cured for an additional 24 hours at 80° C. under vacuum.

Isotropic Reduction 10 g of the "Model 11" silicone-based elastomer was mixed with 50 wt. % of toluene which serves as a guest molecule. The mixture was cured with a quarter dollar to copy a negative 3D-image of the quarter dollar. After curing, the patterned structure was placed in a sealed environment for imaging and measurement. Subsequently, the patterned structure was heated at a moderately elevated temperature to evaporate the toluene, thereby shrinking the size-scale of the patterned structure. The patterned structure again as imaged and measured in order to observe the retention of its relative dimension and the uniform reduction of its details.

Results

Figure 3:
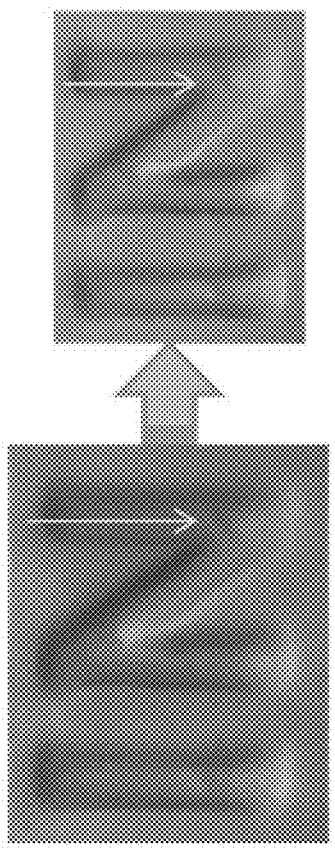
FIG. 3 shows the controlled isotropic contraction of a patterned silicone structure. a) Curing of the elastomer over a 3D pattern results in the faithful reproduction of the 'mold' and even defects such as scratches are reproduced in the silicone elastomer. b) 4× magnification of the letter 'IN' on the silicone both before and after the removal of the guest molecules from the matrix. The dimensions of the pattern are reduced by ~20% without distortion and even small scale defects are retained in the reduced state.
Figure 3:

FIG. 3 shows the controlled isotropic contraction of the patterned silicone structure. FIG. 3A shows curing of the elastomer over a 3D pattern resulted in the faithful reproduction of the 'mold'—even defects such as scratches were reproduced in the silicone elastomer. FIG. 3B shows the 4× magnification of the letter 'IN' on the silicone both before and after the removal of the guest molecules from the matrix. The dimensions of the pattern were isotropically reduced by 23% without distortion, with even small scale defects retained in the reduced state.

Example 2

Figure 4:
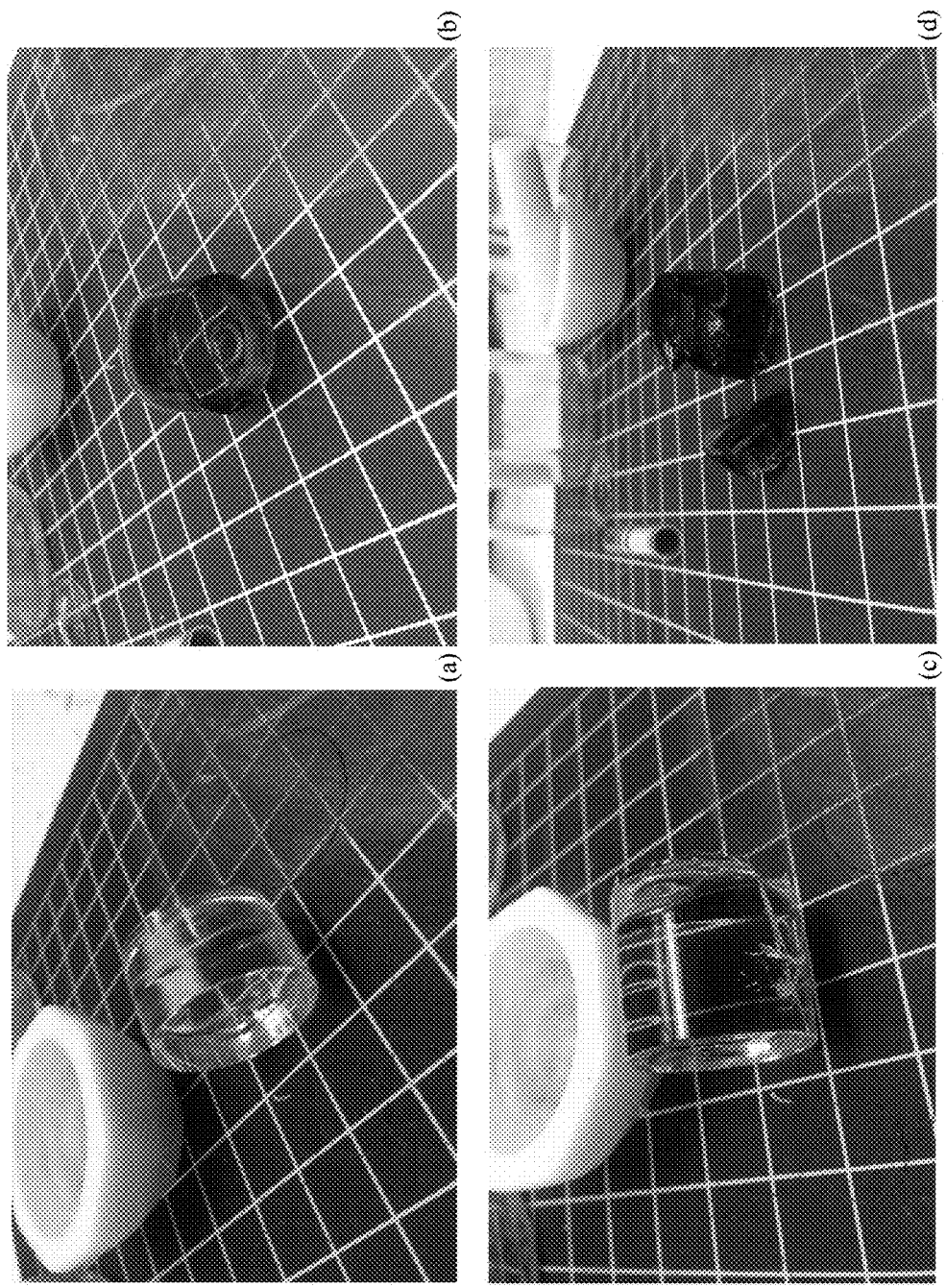
FIG. 4 shows the comparison between the isotropic reduction of the silicon-based elastomers described herein and the non-isotropic reduction of a commercial silicon elastomer. (a) LLNL isotropic silicone in the swollen gel-state; (b) LLNL isotropic silicone after the removal of the guest molecule and contraction (note the retention of dimensional ratios and shape); (c) commercial silicone (Sylgard® 184) incorporating a guest molecule (note that there were already some defects in the part); (d) commercial silicone (Sylgard® 184) after the removal of the guest molecule (the part failed and the dimensional change was highly non-uniform).
Figure 5:
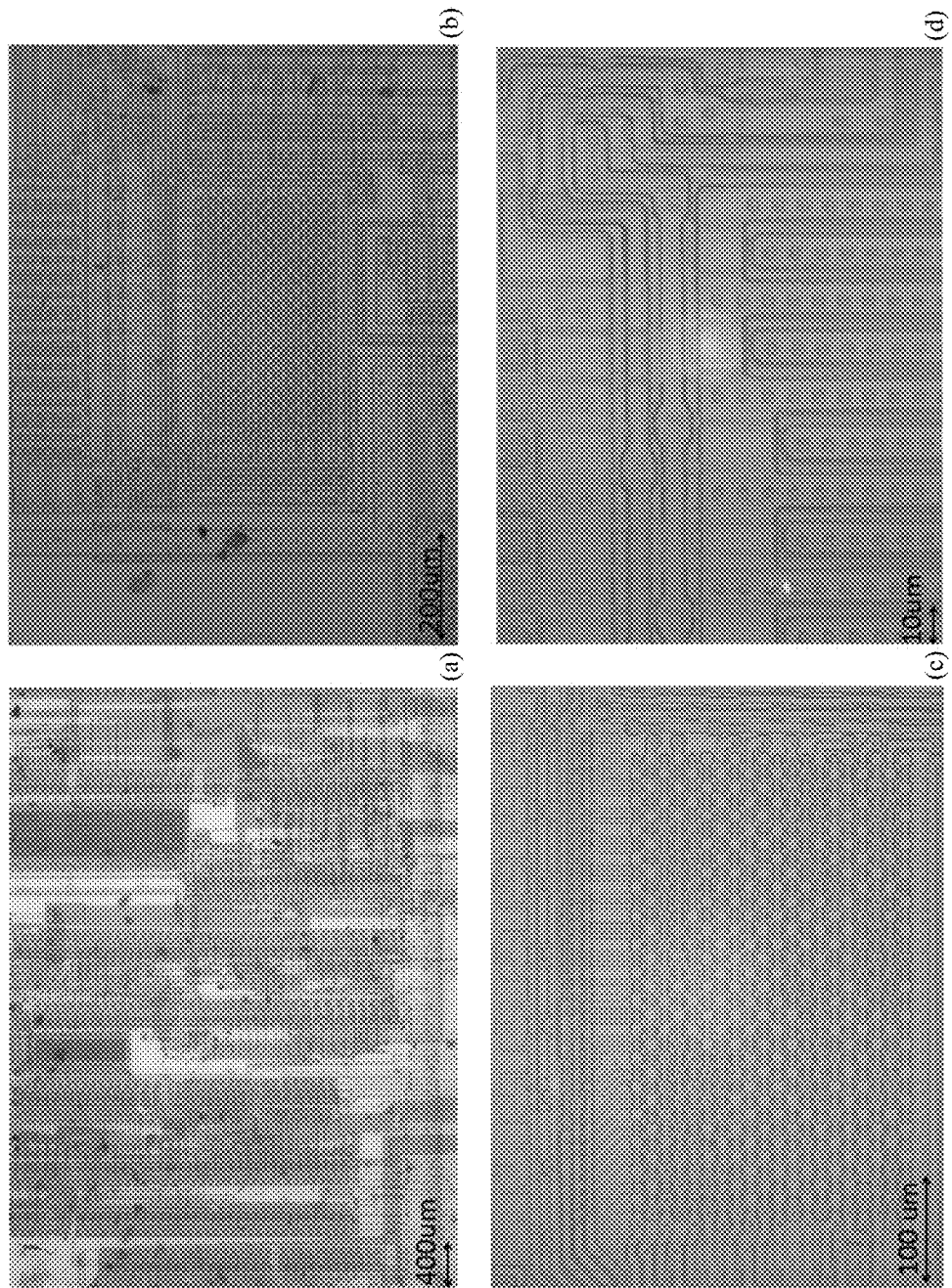
FIG. 5 shows the faithful reproduction of <10 μm features on a silicon elastomer.

The isotropic reduction of the silicon-based elastomers described herein and the non-isotropic reduction of a commercial silicon elastomer were compared. As shown in FIG. 4(a), a cylinder-shaped gel was made from Model 11 as the silicon network and toluene as the guest molecule. As shown in FIG. 4(b), the removal of the guest molecule from the silicon-based elastomer resulted in a dimensional reduction that was isotropic, with the cylindrical shape of the gel retained. The color changes observed were a result of the increased catalyst level in this demonstration, which is not required but could accelerate the curing process.

In comparison, when a commercial silicone (Sylgard® 184) was used in place of Model 11, there was already evidence of defects when the guest molecules were incorporated, as shown in FIG. 4(c). Further, as shown in FIG. 4(d), after the removal of the guest molecule, the gel collapsed, indicating that the dimensional reduction was non-uniform and non-isotropic.

Example 3

FIG. 5(a)-(d) shows the patterns on a silicon elastomer formulation that was reproduced from an etched silicon wafer bearing the pattern of an IC. The resolution (<10 μm) of the pattern reproduction was as good as the resolution of the original chip architecture. The isotropic reduction process as described herein should isotropically reduce the size scale of the patterned structure while retaining the full detail of its features.

What is claimed is:

1. A method for making a microfluidic device, comprising forming a microfluidic pattern comprising at least one line having a width of 500 μm or less with a silicone-based elastomer, wherein the silicone-based elastomer comprises a network of crosslinked polysiloxane having its internal space occupied by a guest molecule, and removing the guest molecule from the silicone-based elastomer to isotropically reduced the volume of the silicone-based elastomer by at least 20%.

2. The method of claim 1, wherein the microfluidic pattern is formed by lithographical deposition.

3. The method of claim 1, wherein the microfluidic pattern is formed by projection microstereolithography.

4. The method of claim 1, wherein the microfluidic pattern comprising at least one line having a width of 100 μm or less.

5. The method of claim 1, wherein the microfluidic pattern comprising at least one line having a width of 10 μm or less.

6. The method of claim 1, wherein the polysiloxane comprises poly(alkyl siloxane).

7. The method of claim 1, wherein the polysiloxane comprises poly(dimethyl siloxane).

8. The method of claim 1, wherein the polysiloxane comprises poly(aryl siloxane).

9. The method of claim 1, wherein the polysiloxane comprises a copolymer comprising poly(alkyl/aryl siloxane).

10. The method of claim 1, wherein the crosslinked polysiloxane is obtained by reacting a reaction mixture comprising vinyl-terminated polysiloxane with a cross-linker, wherein the molar mass of the polysiloxane is between 5,000 to 200,000 g/mol.

11. The method of claim 1, wherein the guest molecule has an affinity for the polysiloxane that is greater than the polysiloxane's own intra/intermolecular interaction strength.

12. The method of claim 1, wherein the guest molecule is a volatile solvent molecule evaporable by heating, and wherein the guest molecule is removed from the silicone-based elastomer by heating.

13. The method of claim 1, wherein the silicone-based elastomer is a gel comprising at least 30 volume % occupied by the guest molecule.

14. The method of claim 1, wherein the silicone-based elastomer is a gel comprising at least 50 volume % occupied by the guest molecule.

15. The method of claim 1, wherein the silicone-based elastomer is a gel comprising at least 70 volume % occupied by the guest molecule.

16. The method of claim 1, wherein the silicone-based elastomer is isotropically reduced by at least 50 volume %.

17. The method of claim 1, wherein the silicone-based elastomer is isotropically reduced by at least 70 volume %.

18. A method for additive manufacturing, comprising printing a patterned structure comprising at least one line having a width of 500 μm or less with an ink comprising a silicone-based elastomer, wherein the silicone-based elastomer comprises a network of crosslinked polysiloxane having its internal space occupied by a guest molecule, and removing the guest molecule from the silicone-based elastomer to isotropically reduced the volume of the silicone-based elastomer by at least 20%.

19. The method of claim 18, wherein the polysiloxane comprises a copolymer comprising poly(alkyl/aryl siloxane).

* * * * *